(12) United States Patent
Nomura

(10) Patent No.: US 6,492,438 B1
(45) Date of Patent: Dec. 10, 2002

(54) ELECTRICALLY CONNECTABLE ADHESIVE AGENT FOR SEMICONDUCTOR

(75) Inventor: Kazuhiro Nomura, Tatsuno (JP)

(73) Assignee: Nagase Chemtex Corporation, Osaka (JP)

(*) Notice: Subject to any disclaimer, the term of this patent is extended or adjusted under 35 U.S.C. 154(b) by 0 days.

(21) Appl. No.: 09/671,311

(22) Filed: Sep. 28, 2000

(30) Foreign Application Priority Data

Apr. 7, 2000 (JP) .......................................... 2000/106527

(51) Int. Cl.⁷ .............................. C08K 3/36; C08L 63/02
(52) U.S. Cl. ..................... 523/466; 523/436; 525/92 H
(58) Field of Search ................... 523/436, 466; 525/92 H

(56) References Cited

U.S. PATENT DOCUMENTS 5,128,746 A    7/1992   Pennisi et al.
5,965,269 A *  10/1999  Inada ......................... 428/413

FOREIGN PATENT DOCUMENTS

WO    WO 98/37134    8/1998

* cited by examiner

*Primary Examiner*—Robert Dawson
*Assistant Examiner*—D. Aylward
(74) *Attorney, Agent, or Firm*—Armstrong, Westerman & Hattori, LLP

(57) ABSTRACT

A chip having a solder bump adheres to a substrate without decreasing wettability to a solder, and without using a step of cleaning a residual fluxing agent. Furthermore, adhesive strength is improved by lowering elastic modulus of the cured material. There is used an electrically connectable adhesive agent for a semiconductor, which comprises an epoxy resin, an acid anhydride curing agent, a curing accelerator and a butadiene-acrylonitrile rubber containing a carboxyl group.

2 Claims, 2 Drawing Sheets

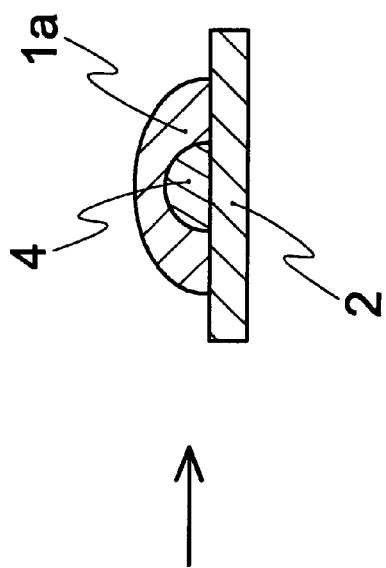
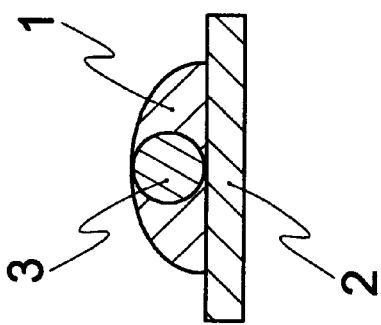
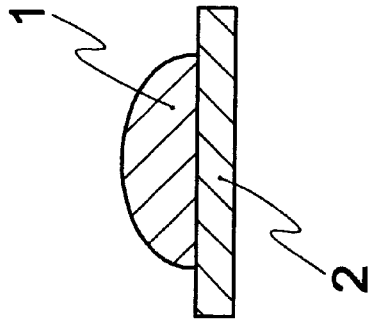

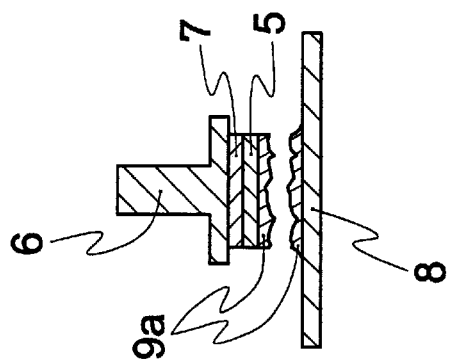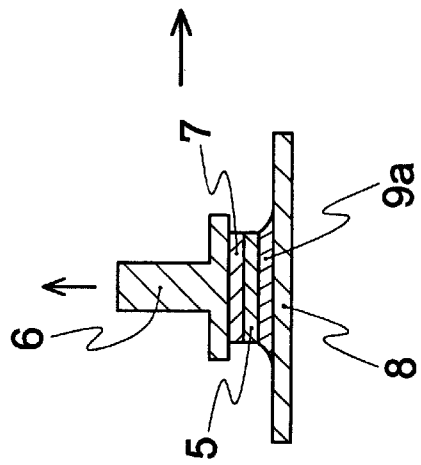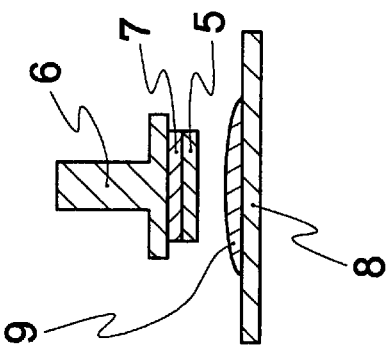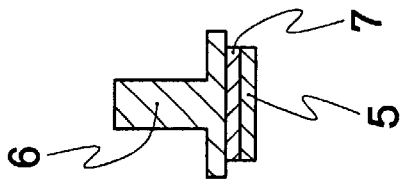

ELECTRICALLY CONNECTABLE ADHESIVE AGENT FOR SEMICONDUCTOR

BACKGROUND OF THE INVENTION

The present invention relates to an electrically connectable adhesive agent for a semiconductor.

Conventionally, a wire-bonding system has been widely employed in order to interconnect an integrated circuit. However, as a connection density becomes higher, there arise limits of a pitch according to the wire-bonding system. Therefore, flip chip method is commonly employed, in which solder bumps are disposed over the area of a chip, and the chip is rendered bottom up, and is connected to a substrate.

Flip chip method commonly comprises the steps of: applying a fluxing agent to a substrate in order to bind a circuit to the substrate; aligning a chip having a solder bump, reflowing the solder by heating to connect the chip having a solder bump and the substrate each other. At this time, the fluxing agent removes an oxide film of a copper foil on the surface of the substrate and the solder to assist the connection by soldering. After the chip having a solder bump and the substrate were connected to each other according to the step of reflowing, it is necessary to wash up all the residual fluxing agent, which will cause corrosion.

After all the residual fluxing agent is washed up, a liquid sealing agent is injected from the side. The connection between the chip having a solder bump and the substrate is completed by heating and hardening the sealing agent.

R. W. Pennisi et al. reported the use of an adhesive agent providing excellent flux effects without washing up the residual fluxing agent. However, there exists a problem that wettability to a solder is decreased, and a filler can not be included therein. Therefore, there is a problem for the reliability thereof as an adhesive agent.

SUMMARY OF THE INVENTION

It is an object of the present invention to provide an adhesive agent, which has high reliability and a flux effect if it is used as a sealing agent for an epoxy flip chip.

The present invention relates to an electrically connectable adhesive agent for a semiconductor, which comprises an epoxy resin, an acid anhydride curing agent, a curing accelerator and a butadiene-acrylonitrile rubber containing a carboxyl group.

The adhesive agent for a semiconductor preferably comprises a filler.

BRIEF DESCRIPTION OF THE DRAWINGS

FIG. 1 is an explanatory drawing for explaining evaluation method of a flux effect.

FIG. 2 is an explanatory drawing for explaining evaluation method of stud pull strength.

DETAILED DESCRIPTION

The adhesive agent of the present invention is an electrically connectable adhesive agent for a semiconductor which is obtained by adding a butadiene-acrylonitrile rubber containing a carboxyl group as a fluxing agent into an adhesive agent for a semiconductor comprising an epoxy resin, an acid anhydride curing agent, a curing accelerator. Since the adhesive agent of the present invention contains the butadiene-acrylonitrile rubber containing a carboxyl group as a fluxing agent, it is not necessary to remove a residual fluxing agent, and wettability between a solder and the adhesive agent is not decreased. Furthermore, a stress thereof can be decreased by lowering an elastic modulus thereof.

As the epoxy resin, there can be used various epoxy resins conventionally used for an adhesive agent for a semiconductor, which is liquid or solid at a room temperature. Examples thereof are an epoxy resin of bisphenol-A, an epoxy resin of bisphenol-F, an epoxy resin of phenol novolak, an epoxy resin of bisphenol AD, an epoxy resin of biphenyl, an epoxy resin of naphthalene, an alicyclic epoxy resin, an epoxy resin of glycidyl ester, an epoxy resin of glycidyl amine, a heterocyclic epoxy resin, an epoxy resin of diallyl sulfone, an epoxy resin of hydroquinone, a modified resin thereof, and the like. Among those, the epoxy resin of naphthalene (an epoxy resin having a naphthalene skeletal) is preferable from the viewpoint of moisture resistance and adhesive property.

As the acid anhydride curing agent, there can be used various curing agents conventionally used for an adhesive agent for a semiconductor. Examples thereof are: a curing agent of an aliphatic anhydride such as dodecenyl succinic anhydride, polyadipic anhydride, polyazelaic anhydride or polysebacic anhydride; a curing agent of an alicyclic anhydride such as methyltetrahydrophthalic anhydride, methylhexahydrophthalic anhydride, methyl nadic anhydride or trialkyltetrahydrophthalic anhydride; a curing agent of an aromatic anhydride such as phthalic anhydride, trimellitic anhydride, pyromellitic anhydride or ethylene glycol bistrimellitic anhydride; a curing agent of a halogen anhydride such as HET anhydride, tetrabromophthalic anhydride; and the like. Among those, methylhexahydrophthalic anhydride, trialkyltetrahydrophthalic anhydride and the like of an alicyclic anhydride curing agent are preferable from the view point of processability and adhesive property when the adhesive agent is applied to a substrate.

As the curing accelerator, there can be used: basic active hydrogen compounds (for example, dicyandiamide, an organic acid hydrazide), tertiary amines (for example, DBU, dimethylbenzylamine), imidazoles (for example, 2-methylimidazole, 2-phenylimidazole), an amine imide, a salt of polyamine, a curing accelerator of micro-capsule (for example, HX3088 available from Asahi Chiba K. K.), an organic phosphine compound, a urea curing accelerator, a metal acetylacetone complex, and the like. Among those, dicyandiamide, a curing accelerator of micro capsule, an organic phosphine compound, a metal acetylacetone complex, imidazoles having high potential, and the like are preferable from the view point of the balance of storage stability, reactivity and the like. Particularly, a curing accelerator of microcapsule is preferable.

The butadiene-acrylonitrile rubber containing a carboxyl group is an oligomer excellent in flexibility and adhesive property, and it acts as the conventional fluxing agent. But there is no need to remove a residual fluxing agent which should be removed when the conventional fluxing agent is employed even after a chip with a solder bump is connected to a substrate by soldering. Furthermore, a lower stress can be provided by lowering an elastic modulus. And wettability to a solder is not decreased in case of a phenoxy resin or spiroorthoester.

As the butadiene-acrylonitrile rubber (an oligomer) containing a carboxyl group, a molecular weight thereof is preferably a number average molecular weight of 1000 to 10000, more preferably 2000 to 5000, from the viewpoint of solubility to the anhydride curing agent.

Example of the above butadiene-acrylonitrile rubber containing a carboxyl group is an oligomer represented by the following general formula (1):

$$HOOC(CH_2CH=CHCH_2)_x(CH_2CH(CN))_yCOOH \qquad (1),$$

wherein x is 10 to 200, y is 1 to 100. The ratio "x/y" is preferably 1 to 20, more preferably 2 to 10, from the viewpoint of lowering elastic modulus of the cured material.

Examples of the above butadiene-acrylonitrile rubber containing a carboxyl group are HYCAR CTBN1008SP (available from Ube Industries, Ltd., viscosity of 135000 mPa·s (27° C.), number average molecular weight of 3550, x/y=4.6), HIKER CTBNX1009SP (Ube Industries, Ltd., viscosity of 160000 mPa·s, number average molecular weight of 3600, x/y=4.6), and the like.

As a ratio of each component used for an adhesive agent of the present invention, an equivalence ratio of an epoxy resin/an acid anhydride curing agent is preferably 1/0.8 to 1/1.2, more preferably 1/0.9 to 1/1.1, from the viewpoint of reactivity and thermal resistance of a cured material. An amount of the curing accelerator is preferably 0.1 to 25 parts by weight, more preferably 0.5 to 10 parts by weight based on 100 parts by weight of the epoxy resin and the acid anhydride curing agent from the viewpoint of reactivity. An amount of the butadiene-acrylonitrile rubber containing a carboxyl group is preferably 2 to 50 parts by weight, more preferably 5 to 30 parts by weight based on 100 parts by weight of the epoxy resin and the acid anhydride curing agent from the viewpoint of thermal resistance, moisture resistance and lowering elastic modulus of the cured material.

If necessary, to the adhesive agent of the present invention may be added various additives such as a filler, a coupling agent, a defoaming agent and a leveling agent.

Examples of the filler are various fillers conventionally used for an adhesive agent for a semiconductor such as the filler having an average particle diameter of 0.1 to 20 μm, the filler having a low coefficient of linear thermal expansion and a high toughness. Examples thereof are fused silica, alumina, titania, aluminum hydroxide, or the like.

An amount of the filler is preferably 5 to 400 parts by weight, more preferably 10 to 100 parts by weight based on total 100 parts by weight of the epoxy resin, the anhydride curing agent and the butadiene-acrylonitrile rubber containing a carboxyl group from the viewpoint of wettability to a solder.

As the other additives, there can be used the various additives conventionally used for an adhesive agent for a semiconductor in an amount as conventionally used.

An example of a process for preparing an adhesive agent of the present invention is described hereinafter.

First, a reactor is charged with an anhydride curing agent and a butadiene-acrylonitrile rubber containing a carboxyl group in an predetermined amount thereof The mixture is heated to 80 to 100° C; and stirred for about 30 to 60 minutes to dissolve the butadiene-acrylonitrile rubber containing a carboxyl group in the anhydride curing agent. When a powder accelerator is used as a curing accelerator, it is preferably added with the butadiene-acrylonitrile rubber containing a carboxyl group to the anhydride curing agent to dissolve the accelerator in the anhydride curing agent.

Then, after cooling to a room temperature, an epoxy resin is mixed in a predetermined amount, and the mixture is stirred and defoamed at a room temperature for about 60 minutes. When the curing accelerator is liquid or paste and is easily dissolved, it may be mixed with the epoxy resin. In this case, if necessary, there may be added a silane coupling agent, a defoaming agent and the like.

The adhesive agent of the present invention thus obtained has a low viscosity and a high adhesive property, and a cured material thereof has a low elastic modulus. It may be used according to a method comprising: supplying the adhesive agent on a substrate by means of dispensing, printing or the like; aligning the same with a bump of a chip having a solder bump; connecting the same by using a solder in a reflow furnace and temporarily curing the adhesive agent; and then finally curing the adhesive agent in an oven.

When the filler is added thereto, it is preferably added and stirred under reduced pressure after sufficiently drying it, for example, at 150° C. for four hours.

The chip and the substrate, which were connected with each other by using the solder, are electrically connected, and have properties such as a high adhesive property, a low coefficient of linear thermal expansion, and high moisture resistance.

The adhesive agent for a semiconductor of the present invention is also useful as an adhesive agent for various miniature parts which require soldering, as well as an adhesive agent as applied between a chip with a solder bump and a substrate.

Next, the adhesive agent of the present invention is explained by using Examples, but the present invention is not limited thereto.

EXAMPLES

There are explained raw materials and evaluation methods which are employed in Examples and Comparative Examples.

Raw Materials

Epoxy resin 1: epoxy resin of bisphenol-A, RE310S available from Nippon Kayaku Co., Ltd.; epoxy equivalent of 185 g/eq.; viscosity of 17000mPa·s Epoxy resin 2: alicyclic epoxy resin, CY179 available from Chiba Special Chemicals Co. Ltd., ; epoxy equivalent of 135 g/eq.; viscosity of 300 mPa·s Epoxy resin 3: epoxy resin of naphthalene, HP4032D available from Dainippon Ink & Chemicals, Inc.,; epoxy equivalent of 141 g/eq.; viscosity of 25000 mPa·s.

Acid anhydride: methylhexahydrophthalic anhydride, HN5500 available from Hitachi Chemical Co., Ltd.,; 168 g/eq.

Curing accelerator: capsule of modified imidazole, NOVACURE HX3088 available from Asahi Chiba K. K.

Acetylacetonano cobalt: available from Mitsuwa Chemicals K. K.

CTBN: Butadiene-acrylonitrile rubber containing a terminal carboxyl group, CTBN1008SP available from Ube Industries, Inc., viscosity of 135000 mPa·s, number average molecular weight of 3550

Fused silica: SO-E4 available from Admatechs Corporation, average particle diameter of 2 μm Glycerol: available from Tokyo Kasei K. K.

Malic Acid: available from Katayama Chemicals K. K.

Abietic Acid: KE604B available from Arakawa Chemicals K. K

Coupling Agent: SAILAACE S-510 available from Chisso K. K

Defoaming Agent: ST86PA available from Toray Dow Corning K. K.

Evaluation method

Effect of Flux

A small amount of the adhesive agent 1 was applied to a copper plate 2 having 30 mm×30 mm which had been heated at 120° C. for 60 minutes (see FIG. 1.(a)), a solder ball 3 (comprising 63% of tin and 37% of lead) having a low melting point and a diameter of 0.75 mm was sunk into the adhesive agent so that the solder ball could be in contact with the surface of the copper plate (see FIG. 1.(b)). These were treated at 150° C. for 90 seconds, and then at 240° C. for 30 seconds. These were cooled to a room temperature, the soldered part of solder 4 was cut and the sectional from was visually observed (see FIG. 1.(c)) to evaluate by the following criteria, In the FIG. 1a shows a cured adhesive agent.

⊚: Solder ball is completely fused, and shape thereof is lost.
○: Solder ball is fused, but shape thereof is a little left.
Δ: Only a lower portion of solder ball is fused, some of them adheres to the copper plate.
X: No solder ball is fused.

Flexural Modulus

The adhesive agent was cured at 160° C. for 3 hours to prepare a test specimen having a size of 2 mm×10 mm×50 mm. Flexural modulus of the test specimen was measured at 25° C. by using a viscoelasticity measuring apparatus DMS 110 (made by SEIKO Electronic K. K).

Stud-pull Strength

A stud 6 made of aluminum having a diameter of 6 mm and a length of 12 mm was bonded to the SiN non-coated surface of a SiN-coated silicon chip 5 having a size of 5 mm×3 mm by using a thermal resistance adhesive agent (see FIG. 2(a);. An adhesive agent 9 was located between this SiN-coated surface and a SiN-coated silicon chip 8 having a size of 10 mm×10 mm. and was cured at 160° C. for 3 hours (see FIG. 2(b), FIG. 2(c)). Thereafter, the SiN-coated silicon chip having a size of 10 mm×10 mm was fixed to a thermal plate at 240° C. the stud was pulled in a vertical direction to measure strength when the adhesive agent was peeled off (see FIG. 2.(d). The measurement was carried out by using the pull tester 2400A (made by DAGE Corporation). In the FIG. 9a represents the cured adhesive agent.

Examples 1 to 4 and Comparative Examples 1 to 4

A reactor was charged with an acid anhydride; one selected from CTBN, glycerol, maleic acid and abietic acid; one selected from a curing accelerator and acetylacetonano cobalt in amounts shown in Table 1. The mixture was heated to 80 to 100° C., and stirred for 30 to 60 minutes to be dissolved.

Thereafter, the mixture was cooled to a room temperature, thereto were mixed an epoxy resin, a silane coupling agent and a defoaming agent described in Table 1. The mixture was stirred and deformed at a room temperature for 60 minutes.

Among the obtained compositions (adhesive agents), compositions in Examples 1 to 4 had excellent wettability to a solder and high flowability. But the compositions in Comparative Examples 1 to 4 had small wettability to a solder.

Flux effect, flexural modulus and stud-pull strength were measured by using the obtained compositions (adhesive agents). The results are shown in Table 1.

The chip and the substrate which were connected by the above soldering were electrically connected to each other, and showed high adhesive property, a low coefficient of linear thermal expansion and high moisture resistance.

Examples 5 and 6

A reactor was charged with an acid anhydride; one selected from CTBN, glycerol, maleic acid and abietic acid; and one selected from a curing accelerator and acetylacetonano cobalt in amounts described in Table 1. The mixture was heated to 80 to 100° C., and stirred for 30 to 60 minutes to be dissolved.

Thereafter, the mixture was cooled to a room temperature, thereto were mixed an epoxy resin, a silane coupling agent and a defoaming agent described in Table 1. After the mixture was stirred for 10 minutes and dried at 150° C. for 4 hours, a fused silica cooled to a room temperature was mixed and stirred and defoamed at a room temperature for 60 minutes.

The obtained compositions (adhesive agents) had excellent wettability to a solder and high flowability. Flux effects, flexural modulus and stud-pull strength were measured by using the obtained compositions (adhesive agents). The results are shown in Table 1.

By the way, the chip and the substrate which were connected by the above soldering were electrically connected to each other, and showed high adhesive property, a low coefficient of linear thermal expansion and high moisture resistance.

TABLE 1

| Ex. No. | Ex. 1 | Ex. 2 | Ex. 3 | Ex. 4 | Ex. 5 | Ex. 6 | Com. Ex. 1 | Com. Ex. 2 | Com. Ex. 3 | Com. Ex. 4 |
|---|---|---|---|---|---|---|---|---|---|---|
| Composition (parts) | | | | | | | | | | |
| Epoxy resin 1 | 100 | — | — | — | 100 | 100 | — | — | 100 | — |
| Epoxy resin 2 | — | 100 | — | — | — | — | — | 100 | — | — |
| Epoxy resin 3 | — | — | 100 | 100 | — | — | 100 | — | — | 100 |
| Acid anhydride | 85 | 120 | 112 | 112 | 85 | 85 | 112 | 100 | 85 | 112 |
| Curing agent | 2 | 2 | 2 | 2 | 2 | 2 | 2 | — | 2 | 2 |
| Acetylacetonano cobalt | — | — | — | — | — | — | — | 0.2 | — | — |
| CTBN | 19 | 22 | 22 | 5 | 19 | 19 | — | — | — | — |
| Fused silica | — | — | — | — | 87 | 204 | — | — | — | — |
| Glycerol | — | — | — | — | — | — | — | 1.0 | — | — |
| Maleic acid | — | — | — | — | — | — | — | — | 25 | — |
| Abietic acid | — | — | — | — | — | — | — | — | — | 22 |
| Coupling agent | 5 | 5 | 5 | 5 | 5 | 5 | 5 | 0.5 | 1 | 5 |
| Defoaming agent | 0.005 | 0.005 | 0.005 | 0.005 | 0.005 | 0.005 | 0.005 | 0.005 | 0.005 | 0.005 |
| Evaluation criteria | | | | | | | | | | |
| Effect of flux | ⊚ | ⊚ | ⊚ | ○ | ⊚ | ○ | X | Δ | Δ | Δ |
| Flexural modulus (Gpa) | 2.5 | 2.8 | 2.4 | 3.0 | 4.5 | 5.4 | 3.5 | 3.6 | 4.0 | 3.5 |
| Stud-pull strength (240° C.)(N/5 mm × 5 mm) | 21 | 27 | 23 | 20 | 23 | 25 | 11 | 4 | 10 | 12 |

When the adhesive agent of the present invention is used, a chip having a solder bump can adhere to a substrate without decreasing wettability to a solder, and without using a step of cleaning a residual fluxing agent. Furthermore, since the elastic modulus of the cured material is decreased, adhesive strength can be improved.

What is claimed is:

1. An electrically connectable adhesive agent for a semiconductor, which comprises an epoxy resin, an acid anhydride curing agent, a curing accelerator and a butadiene-acrylonitrile rubber containing a carboxyl group, said butadiene-acrylonitrile rubber having a number average molecular weight of 1000 to 10000.

2. The adhesive agent for a semiconductor of claim 1, further comprising a filler.

* * * * *